United States Patent
Saloka et al.

(10) Patent No.: US 6,315,820 B1
(45) Date of Patent: Nov. 13, 2001

(54) METHOD OF MANUFACTURING THIN METAL ALLOY FOILS

(75) Inventors: George Steve Saloka, Dearborn; Mujeeb Ismael Ijaz, Ypsilanti, both of MI (US); Prabhakar Singh, Export, PA (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/420,620

(22) Filed: Oct. 19, 1999

(51) Int. Cl.⁷ .......................... B01D 53/22; B01D 131/20
(52) U.S. Cl. ........................ 96/11; 95/56; 55/DIG. 5; 427/383.7; 427/405; 428/607; 428/670; 428/674
(58) Field of Search .................. 95/55, 56; 96/7, 96/11; 55/DIG. 5; 427/383.3, 383.7, 405, 436; 428/566, 567, 606, 607, 670–674

(56) References Cited

U.S. PATENT DOCUMENTS

| | | | |
|---|---|---|---|
| 3,247,648 | * | 4/1966 | McKinley ................. 95/56 |
| 3,350,845 | * | 11/1967 | McKinley ................. 95/56 |
| 3,428,476 | * | 2/1969 | Langley et al. .......... 96/11 X |
| 3,439,474 | * | 4/1969 | McKinley ................. 95/56 |
| 3,717,525 | * | 2/1973 | Bültemann ............... 96/11 X |
| 4,496,373 | * | 1/1985 | Behr et al. .............. 96/11 X |
| 5,149,420 | | 9/1992 | Buxbaum et al. . |
| 5,498,278 | * | 3/1996 | Edlund .................... 95/56 X |
| 5,518,530 | * | 5/1996 | Sakai et al. ............. 95/56 X |
| 5,645,626 | | 7/1997 | Edlund et al. . |
| 5,738,708 | | 4/1998 | Peachey et al. . |
| 5,904,754 | * | 5/1999 | Juda et al. .............. 95/56 X |
| 6,152,987 | * | 11/2000 | Ma et al. ................ 95/56 |
| 6,152,995 | * | 11/2000 | Edlund ................... 95/56 X |

FOREIGN PATENT DOCUMENTS

| | | | |
|---|---|---|---|
| 19738513C | 11/1998 | (DE) . | |
| 53-047792 | * 12/1978 | (JP) ........ | 95/56 |
| 63-294925 | * 12/1988 | (JP) ........ | 96/11 |
| 63-295402 | * 12/1988 | (JP) ........ | 95/56 |

\* cited by examiner

*Primary Examiner*—Robert H. Spitzer
(74) *Attorney, Agent, or Firm*—Damian Porcari; William J. Coughlin

(57) ABSTRACT

A method of manufacturing thin foil alloys through a series of steps. A carrier having a polished carrier surface is placed within a deposition chamber. The carrier surface is generally polished to a mirrored surface finish. A sacrificial layer is applied atop the carrier surface. The sacrificial layer is made of a material that may be easily dissolved or separated from the carrier surface to remove the metal foil. The carrier surface and sacrificial layer are placed within the deposition chamber. The sacrificial layer is exposed to an evaporated first metal which becomes deposited upon the sacrificial layer. An evaporated second metal is then applied concurrently or sequentially with the first metal. The first and second evaporated metals solidify on the sacrificial layer to form a multilayer foil. At this point, the multilayer foil includes discrete layers or areas of the evaporated metals.

13 Claims, 2 Drawing Sheets

METHOD OF MANUFACTURING THIN
METAL ALLOY FOILS

BACKGROUND OF THE INVENTION

1. Field of the Invention

The present invention is directed to a method of manufacturing thin metal alloy foils using evaporative techniques. More specifically, the present invention is directed to manufacturing metal alloy foils by depositing layers of different metals and heating the layers to form the alloy.

2. Discussion of Related Art

It is desirable to manufacture thin metal alloy foils for a wide variety of applications. One such application includes separators for chemical components. This invention will be described as a method of manufacturing a thin metal foil that may be used as a separator. The separator is exposed to a mixed gas stream on one surface. The separator material allows one component of the gas stream to pass through the material and separate one selected gas at very high concentration from the mixed gas stream.

Metal separators have been used to separate hydrogen from a gas stream containing hydrogen and other gases. Hydrogen separators generally operate by catalyzing the hydrogen gas into hydrogen atoms that selectively pass through the foil. The hydrogen atoms recombine on the opposite surface of the foil to form hydrogen gas. The permeability of the separator increases as the foil thickness decreases. Thin metal foils are much more efficient in separating hydrogen gas than thicker foils.

Traditionally, the metal foils have been made by a rolling or pressing technique. An ingot of metal having a desired composition is cast and rolled or pressed into a foil. This rolling or pressing technique is only capable of producing a consistently pinhole free foil having a thickness not less than 25 microns. The foil may tear and have pinholes when it is rolled to a thickness less than 25 microns.

It is also desirable to manufacture the foil from a number of metals to form an alloy. The metal alloy has superior physical properties such as non-embrittlement, and may be more effective at separating one component from a mixed gas stream. The metal alloy has traditionally been formed by blending metal powders or shots and then heating the mixture to melt the metals. The molten metals blend and form an alloy when cooled. The alloy ingot is then rolled or pressed to form the thin metal foil.

The problem with rolling the alloy is that it takes many successive "rolls and anneals" to produce a thin film. An ingot of an alloy cannot be rolled down to the desired thickness in one trial. The ingot is rolled down a few millimeters at a time with an anneal in between each rolling action.

It is also possible to electrochemically deposit metal onto a surface such as a ceramic or metal substrate. Very thin coatings are possible using this technique. Electroless plating is an example of an electrochemically deposited metal. The problem with electroless plating is that it introduces unwanted elements to the material. The present invention is intended to produce self supporting foils that will be used independently from the carrier and have a high degree of elemental purity.

The present invention attempts to provide a method of manufacturing thin alloy foils that does not utilize a rolling or pressing process. The method enables the manufacture of very thin foils having metallurgical compositions not attainable through conventional alloying methods. These and other disadvantages of the related arts are overcome by the method described herein.

SUMMARY OF THE INVENTION

The present invention is directed to a method of manufacturing thin foil alloys through a series of steps. A carrier having a polished carrier surface is placed within a deposition chamber. A sacrificial layer is applied atop the carrier surface. The sacrificial layer is made of a material that may be easily dissolved or separated from the carrier surface to remove the metal foil. Suitable sacrificial layers include common photo resist layers used in electrical circuit board manufacturing.

The carrier surface and sacrificial layer are placed within the deposition chamber. The sacrificial layer is exposed to an evaporated first metal which becomes deposited upon the sacrificial layer. An evaporated second metal is then applied concurrently or sequentially with the first metal. The first and second evaporated metals solidify on the sacrificial layer to form a multilayer foil. At this point, the multilayer foil includes discrete layers or areas of the evaporated metals.

The carrier, sacrificial layer, and multilayer foil are bathed with a solvent to dissolve the sacrificial layer. The multilayer foil is removed from the carrier surface. The multilayer foil is placed within a reducing atmosphere and exposed to elevated temperatures. The multilayer foil forms an alloy of the deposited metals. The method described enables the production of thin metal foils having a thickness of between 1 and 10 microns. The invention is especially useful for the production of foils of 5 microns or thinner. Micron foils of less than 1 micron have been produced. A foil less than 1 micron may be fabricated, but, may be difficult to use without tearing.

Furthermore, the method enables the manufacture of foils made from dissimilar metals. The invention has been tested and will be described as a method of making thin metal foils for use as a hydrogen separator. In this application, alloys of palladium and copper were preferred. Other applications and other metal compositions are also possible using the methods described and claimed herein.

Other possible metal compositions include, but are not limited to the following: Pd—Ag, Pd—Y, and V—Cu. These alloys may be used in optical, sensing, catalytic, and wear friction, applications.

The use and other desired objects of the present invention will become more apparent in the course of the following detailed description and the appended claims. The invention may best be understood with reference to the accompanying drawings wherein illustrative embodiments are shown.

DETAILED DESCRIPTION AND BEST MODE

Figure 1:
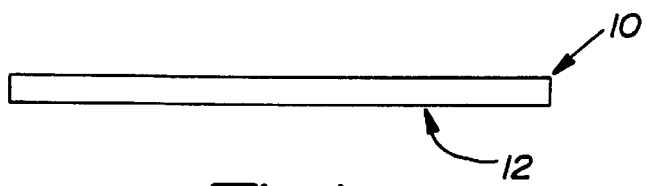
FIG. 1 is a cross-sectional view of the substrate.

The invention will be illustrated and described as a method of making a thin metal foil. The foil is particularly useful in the manufacture of hydrogen separators. However, other metal foils, particularly those requiring metal alloys may be manufactured using the method described. These and other devices and methods of manufacture are included within the invention described herein. The following items are a word list of the components described in the drawings and are reproduced to aid in understanding the invention:

Word List:
10 substrate
12 substrate surface
14 sacrificial layer
16 deposition chamber
18 crucible
20 first metal
22 first metal layer
24 crucible
26 second metal
28 second metal layer
30 multilayer foil
32 metal alloy foil Illustrated in FIG. 1 is the substrate 10 that will receive the evaporated metal. The substrate 10 is made from a 4 inch single crystal silicon polished wafer. However, any smooth substrate that has the mechanical characteristics of silicon may be used.

Figure 2:
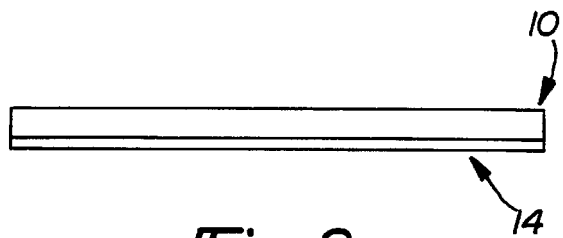
FIG. 2 is a cross-sectional view of the substrate and sacrificial layer.
Figure 3:
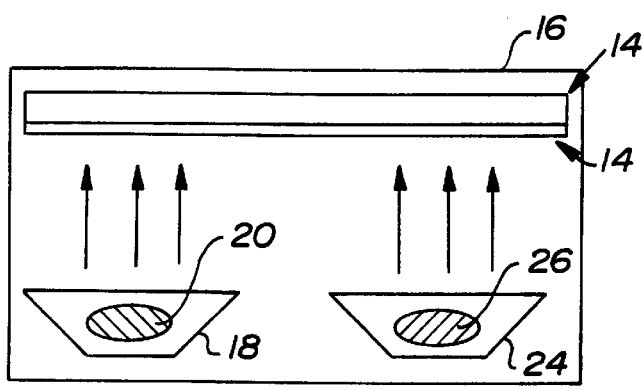
FIG. 3 is a cross-sectional view of the evaporative deposition step.

The substrate 10 is polished to a mirrored surface finish of about 0.5 microns. A highly polished surfaced allows the sacrificial layer to be easily removed. The substrate may be flat to make foil sheets, or may be cylindrical to make tubular shaped metal foils. The substrate 10 has a substrate surface 12. The substrate surface 12 receives a sacrificial layer 14 as illustrated in FIG. 2. The sacrificial layer 14 is a temporary layer that is easily removed to separate the metal foil from the substrate. Suitable sacrificial layers include wax, grease, oil, and photo resist. Photoresist is a photosensitive polymer commonly used in the electronics industry to apply chemically resistive patterns to silicon wafers. The manufacturer of the photoresist used in this application is Hoechst Celanese. The sacrificial layer 14 is created by spinning the substrate at a high rate and applying the photoresist. The photoresist is approximately 0.8 to 1.5 microns thick.

After the solvents in the sacrificial layer 14 are allowed to evaporate, the substrate 10 and sacrificial layer 14 are placed within a deposition chamber 16. The deposition chamber 16 may be an evaporative deposition, sputtering deposition, or chemical vapor deposition device.

Figure 4:
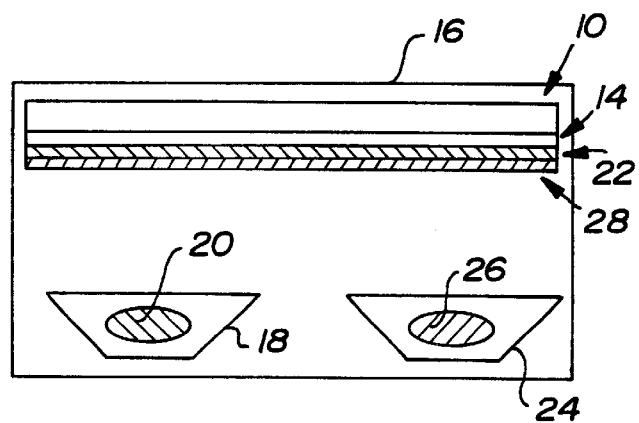
FIG. 4 is a cross-sectional view of the multilayer foil applied atop the sacrificial layer.
Figure 5:
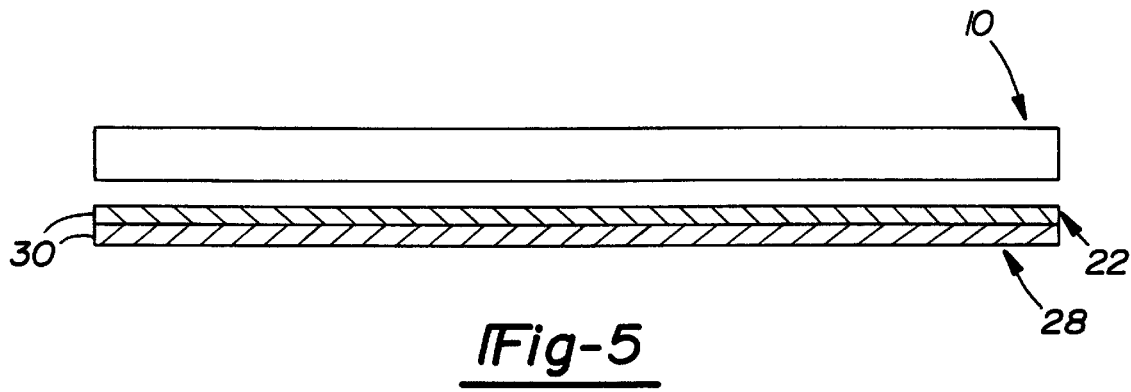
FIG. 5 is a cross-sectional view of the sacrificial layer removal process.
Figure 6:
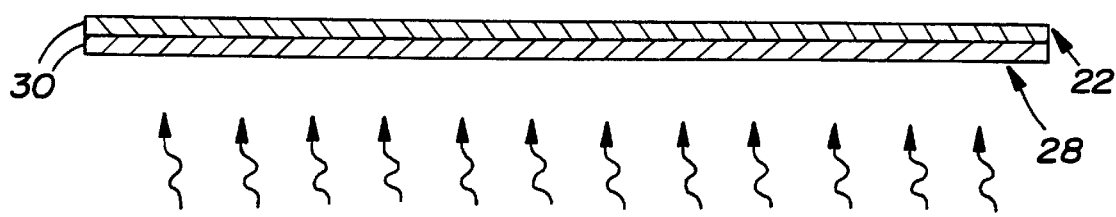
FIG. 6 is a cross-sectional view of the heating step.

When using vacuum deposition, the air within the chamber 16 is removed to provide a mean free path for the evaporated material. A crucible 18 containing a first metal 20 is heated. The first metal 20 evaporates and deposits a first metal layer 22 atop the sacrificial layer 14 as illustrated in FIG. 4. Concurrently or subsequent to the deposition of the first metal layer 22, a crucible 24 heats a second metal 26 and causes the second metal to evaporate. The second metal 26 deposits a second metal layer 28. The first and second metal layers 22, 28 form a multilayer foil 30 as illustrated in FIGS. 5 and 6. The multilayer foil 30 includes discrete layers for areas of the individual metals 20, 26. The multilayer foil 30 does not yet have the physical properties of an alloy.

The substrate 10, sacrificial layer 14, and multilayer foil 30 are placed within a solvent bath to dissolve the sacrificial layer 14 and releases the multilayer foil 30 from the substrate 10. Acetone was found to be a suitable solvent for removing a photo resist sacrificial layer.

Figure 7:
FIG. 7 is a cross-sectional view of the thin metal foil.

The multilayer foil 30 is placed within a reducing atmosphere furnace as illustrated in FIG. 6. The multilayer foil 30 is heated sufficiently to cause the first and second metal layers 22, 28 to form an alloy. An alloy is a metal that is prepared by adding other metals or nonmetals to a basic metal to secure desirable properties. Usually alloying metals increase the hardness of the original base metal. The multilayer foil 30 is transformed into a self supporting thin alloy foil 32 as illustrated in FIG. 7.

To prevent the unwanted oxidation of the metals or alloy, the multilayer foil 30 is heated in a reducing atmosphere such as hydrogen. The method thus described enables the production of alloy foils 32 having a thickness of between 1 micron and 5 microns.

EXAMPLE

The following examples describe the formation of a two-component alloy foil. However, three or more metal alloys may be manufactured using the same or similar techniques. An alloy foil having a composition of 60% palladium and 40% copper is desired. A 4-inch, single crystal silicon wafer acts as the substrate. The wafer is chem-mechanical polished to a surface flatness of +/−6 micron. The wafer is placed within a holder rotating vacuum chuck. A photo resist of AZ1512 is spun onto the silicon wafer surface to form the sacrificial layer. The photo resist is applied by conventional spinning techniques and has a thickness of between 0.8 and 1 micron. After the photo-resist is applied to the wafer, the wafer and photo resist is baked under a heat lamp for 20 minutes to evaporate the solvents in the photo resist. The photo resist hardens to a smooth finish without additional processing.

A TEMESCAL electron beam metal evaporation system is used to evaporate the metal onto the surface of the photo resist. The silicon wafers are loaded into a planetary mechanism that rotates the silicon wafers during deposition. Rotating the wafers during deposition decreases the surface irregularities of the deposited metal. The individual metal layer thickness may be determined using the following formula:

$$t_c/t_p = \rho Pd^* F_c[\rho Cu^*(1-F_c)]$$

where $t_c$ equals copper thickness $t_p$ equals palladium thickness $\rho Pd$ equals density of palladium (12.02 grams/cc)

$\rho Cu$ equals density of copper (8.96 grams/cc)

$F_c$ equals weight fraction of copper (40%)

To produce an alloy containing 60% palladium and 40% copper, $t_c/t_p$ equals 0.894. Thus, the ratio between the copper and palladium layers is 1:0.894.

The copper was evaporated in increments of 5000 angstroms and the palladium was evaporated in increments of 4470 angstroms. A total thickness of 4.2 microns was evaporated. The silicon wafer was removed from the evaporation system and immersed in acetone. The multilayer foil immediately released from the silicon wafer to form a 4.2 micron thick multilayer foil. The multilayer foil was placed in a tube furnace for two hours at 800° C. in a 3% hydrogen reducing atmosphere. The multilayer foil was transformed into a homogeneous uniform alloy.

The alloy foil was analyzed using x-ray diffraction analysis. The results indicate a homogeneous alloy structure. Quantitative composition analysis was performed using scanning electron microscope (SEM) energy dispersive spectroscopy (EDS). The results indicate a metal alloy having an elemental composition of 40.65% copper and 59.35% palladium. SEM photographs of the alloy foil indicate a tight, pin-hole free grain structure.

While particular embodiments of the invention have been illustrated and described, it will be clear to those skilled in the art that various changes and modifications may be made thereto without departing from the scope of the invention and it is intended to cover in the appended claims all such modifications and equivalents as fall within the true spirit and scope of the invention.

What is claimed:

1. A hydrogen separating multilayer alloy foil comprising; a first Pd layer; and a second Cu layer; whereby said first and second layers form a self-supporting alloy foil having a composition between 59% and 60% Pd and the balance Cu and a combined thickness between 1 and 5 microns.

2. A method of manufacturing thin alloy foil; comprising the steps of:

providing a carrier having a surface;

applying a first metal layer atop said carrier surface;

applying a second metal layer atop said first layer;

removing said first and second metal layers from said carrier surface; and alloying said first and second metal layers to form said alloy foil.

3. The method of claim 2, further comprising applying a sacrificial layer atop said carrier surface and applying said first metal layer atop said sacrificial layer.

4. The method of claim 3, further comprising removing said sacrificial layer after applying said second metal layer, separating said first and second layers from said carrier surface.

5. The method of claim 2, wherein said first metal layer is selected from the metal group consisting of palladium and copper.

6. The method of claim 2, wherein said alloying step consists of heating said first and second metal layers.

7. The method of claim 6, further comprising heating said first and second metal layers in a reducing atmosphere.

8. The method of claim 2, wherein said alloy foil has a thickness of between 1 and 5 microns.

9. A method of manufacturing a hydrogen separator comprising the steps of:

providing a carrier having a surface;

applying a sacrificial layer atop said carrier surface;

applying a first metal layer atop said carrier surface;

applying a second metal layer atop said first layer;

removing said sacrificial layer;

removing said first and second metal layers from said carrier surface; and alloying said first and second metal layers to form said hydrogen separator.

10. The method of claim 9, wherein said first metal layer is selected from the metal group consisting of palladium and copper.

11. The method of claim 9, wherein said alloying step consists of heating said first and second metal layers.

12. The method of claim 9, further comprising heating said first and second metal layers in a reducing atmosphere.

13. The method of claim 9, wherein said alloy foil has a thickness of between 1 and 5 microns.

\* \* \* \* \*